(12) United States Patent
Iriguchi et al.

(10) Patent No.: US 10,342,129 B2
(45) Date of Patent: Jul. 2, 2019

(54) SUBSTRATE AND METHOD OF MANUFACTURING THE SAME

(71) Applicant: FUJITSU LIMITED, Kawasaki-shi, Kanagawa (JP)

(72) Inventors: Shigeo Iriguchi, Kawasaki (JP); Takahiro Kitagawa, Kawasaki (JP); Mitsunori Abe, Kawasaki (JP); Shigeru Sugino, Edogawa (JP); Nobuo Taketomi, Kodaira (JP); Kiyoyuki Hatanaka, Kawasaki (JP); Ryo Kanai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/945,762

(22) Filed: Apr. 5, 2018

(65) Prior Publication Data
US 2018/0310405 A1    Oct. 25, 2018

(30) Foreign Application Priority Data

Apr. 20, 2017  (JP) ................................ 2017-083949

(51) Int. Cl.
| | | |
|---|---|---|
| H05K 1/18 | (2006.01) | |
| H05K 1/11 | (2006.01) | |
| H05K 1/03 | (2006.01) | |
| H05K 3/00 | (2006.01) | |
| H05K 3/22 | (2006.01) | |
| H01R 12/71 | (2011.01) | |

(52) U.S. Cl.
CPC ............... *H05K 1/11* (2013.01); *H01R 12/71* (2013.01); *H05K 1/0373* (2013.01); *H05K 3/0017* (2013.01); *H05K 3/0044* (2013.01); *H05K 3/22* (2013.01)

(58) Field of Classification Search
CPC .......... H05K 3/306; H05K 3/308; H05K 1/11; H05K 1/0373; H05K 3/0019; H05K 3/0044; H05K 3/22; H05K 2201/10295; H05K 2201/10303; H05K 1/184; H01R 12/585; H01R 13/03; H01R 12/71
USPC .......... 361/792, 794; 174/266; 257/778, 780
See application file for complete search history.

(56) References Cited

U.S. PATENT DOCUMENTS

| | | | | |
|---|---|---|---|---|
| 3,276,106 A | * | 10/1966 | Bester ..................... | H05K 3/429 174/256 |
| 3,348,990 A | * | 10/1967 | Pisan ..................... | H05K 1/115 156/253 |
| 3,446,908 A | * | 5/1969 | Tally ....................... | H05K 3/328 174/266 |
| 5,543,586 A | * | 8/1996 | Crane, Jr. ......... | H01L 23/49811 174/260 |
| 2010/0163297 A1 | * | 7/2010 | Kajihara .............. | H05K 3/0032 174/264 |

(Continued)

FOREIGN PATENT DOCUMENTS

| | | |
|---|---|---|
| JP | 61-83079 U | 6/1986 |
| JP | 2005-353774 | 12/2005 |

*Primary Examiner* — Steven T Sawyer
(74) *Attorney, Agent, or Firm* — Fujitsu Patent Center (57) ABSTRACT

A substrate includes an insulation layer including a glass cloth impregnated with a resin, and a through hole having a hole included in the insulation layer and plating formed in an inner surface of the hole, where a location, intersecting with the glass cloth, of an outer circumferential portion of the through hole has a recessed portion recessed toward an outside of the hole.

4 Claims, 14 Drawing Sheets

(56) References Cited

U.S. PATENT DOCUMENTS

2012/0132462 A1* 5/2012 Harazono ............ H05K 1/0366
174/260
2013/0319749 A1* 12/2013 Ohashi ................ H05K 3/0032
174/262

* cited by examiner

Related Art

FIG. 7B
Related Art

SUBSTRATE AND METHOD OF MANUFACTURING THE SAME

CROSS-REFERENCE TO RELATED APPLICATIONS

This application is based upon and claims the benefit of priority of the prior Japanese Patent Application No. 2017-83949, filed on Apr. 20, 2017, the entire contents of which are incorporated herein by reference.

FIELD

The embodiment discussed herein is related to a substrate and a method of manufacturing the substrate.

BACKGROUND

As environmental improvement advances socially, parts and manufacturing methods of electronic devices to reduce toxic substances are called for. A press-fit pin is known, which is mounted in a printed substrate (hereinafter also referred to as a substrate) by a press-fit method (press-fit method). To fit a press-fit pin to a through hole of a substrate, the press-fit pin can be mounted in the substrate without using solder. However, a press-fit pin has a connection structure using press fitting, thus imposes a heavy load to a substrate or a through hole, and importance is placed on improvement in reliability of a substrate.

The followings are reference documents.
[Document 1] Japanese Laid-open Patent Publication No. 2005-353774, and
[Document 2] Japanese Laid-open Utility Model Publication No. 61-83079.

SUMMARY

According to an aspect of the invention, a substrate includes an insulation layer including a glass cloth impregnated with a resin, and a through hole having a hole included in the insulation layer and plating formed in an inner surface of the hole, where a location, intersecting with the glass cloth, of an outer circumferential portion of the through hole has a recessed portion recessed toward an outside of the hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

First, a press-fit pin to be mounted by a press-fit method will be described.

A press-fit pin has a structure including a spring elastic section. The diameter of the press-fit pin is greater than the diameter of a corresponding through hole. Also, the press-fit pin is formed to allow elastic deformation. When a press-fit pin is press-fitted in a through hole, the through hole is pressed by the elastic force of the press-fit pin, and the press-fit pin is electrically connected as well as mechanically fixed to the through hole.

Figure 7A:
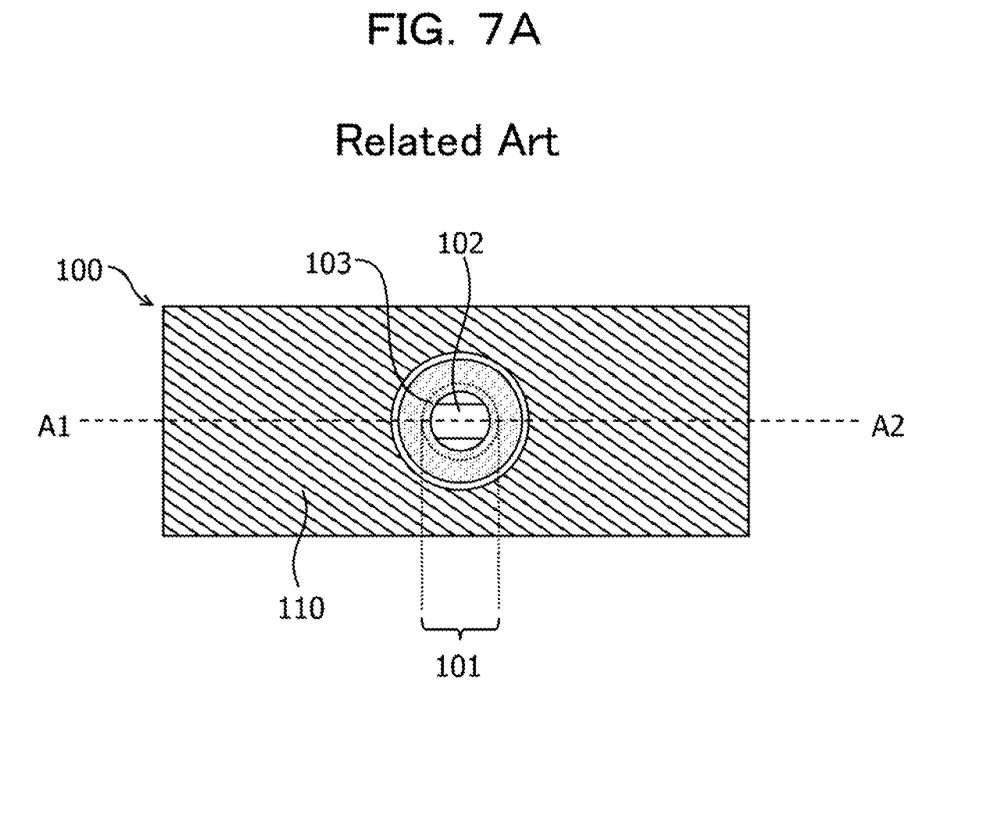
FIG. 7A is a plan view of a printed substrate.
Figure 7B:
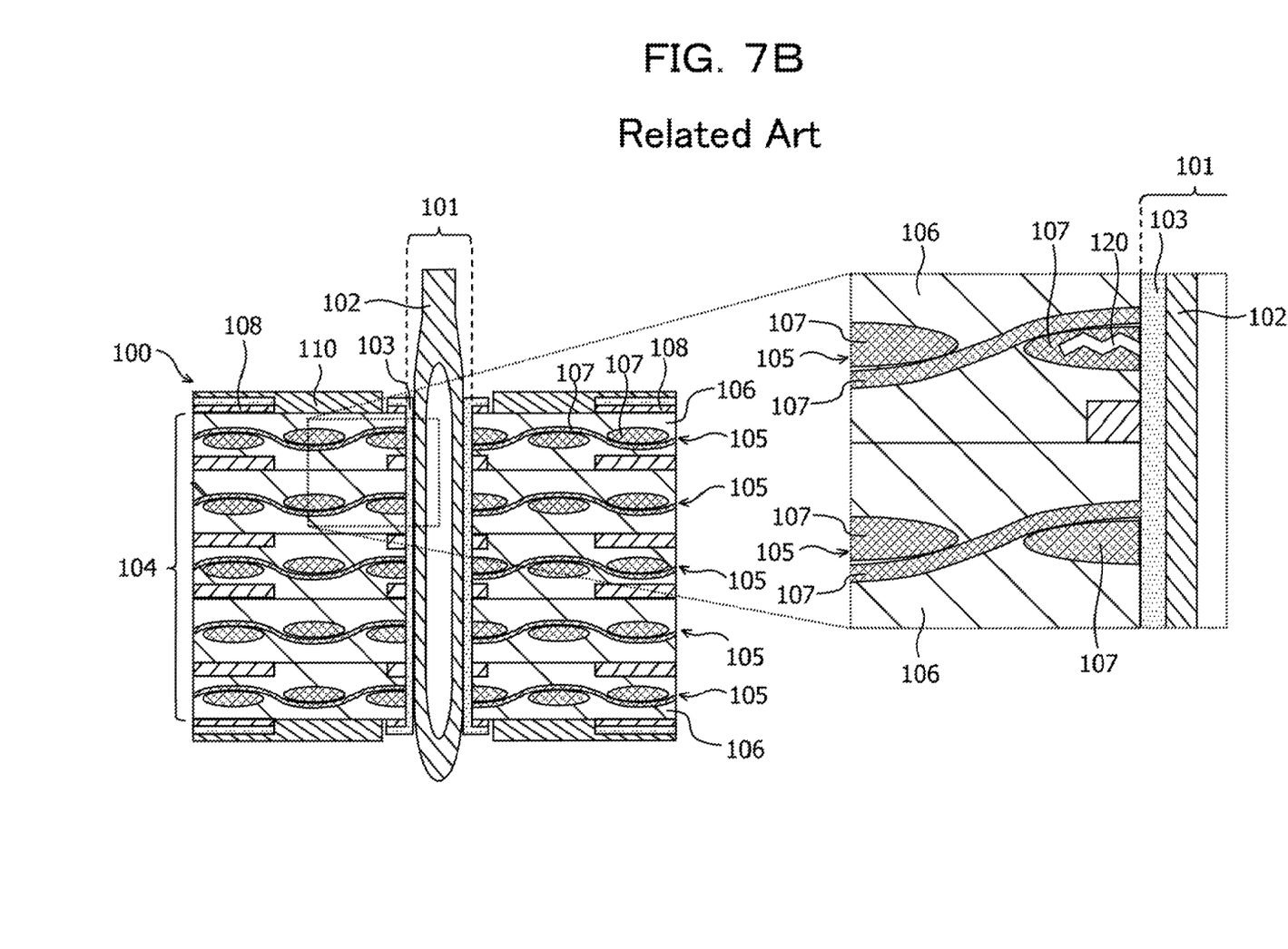
FIG. 7B is a sectional view of a printed substrate.

FIG. 7A is a plan view of a printed substrate 100, and illustrates a state where a press-fit pin 102 is press-fitted in a through hole 101 of a printed substrate 100. FIG. 7B is a sectional view of the printed substrate 100, and illustrates a cross section along a dotted line A1-A2 of FIG. 7A. The through hole 101 has a penetrating hole that penetrates the printed substrate 100, and plating 103 formed in the inner surface of the penetrating hole. A resist 110 is formed on the printed substrate 100. The through hole 101 is pressed by the elastic force of the press-fit pin 102, and a pressure is applied to an insulation layer 104 around the through hole 101. The insulation layer 104 has a glass cloth (glass fabric) 105 and a resin 106. The glass cloth 105 is woven from a plurality of glass fibers 107.

When a pressure applied to the insulation layer 104 around the through hole 101 is increased, a pressure applied to the glass cloth 105 around the through hole 101 is also increased, and thus the glass cloth 105 may be damaged, air gap 120 may occur in the glass cloth 105. In a portion of the air gap 120 has occurred in the glass cloth 105, the printed substrate 100 looks white, and thus the portion is also called whitening of a substrate. When water is accumulated in the air gap 120 of the glass cloth 105, insulation deterioration may occur.

In order to ensure insulation between the through hole 101 and a wiring pattern (conductor) 108 adjacent to the through hole 101, the distance between the through hole 101 and the wiring pattern 108 is maintained at a certain level. Therefore, it is difficult to dispose a wiring pattern 108 between through holes 101 or to dispose a wiring pattern 108 near a through hole 101, and it is difficult to shorten the pitch of the through holes 101. The printed substrate 100 is designed under the assumption of occurrence of the air gap 120 in the glass cloth 105. Therefore, the layout around the through hole 101 is designed with a gap greater than a minimum gap between the wiring patterns 108 defined by the specification of the printed substrate 100.

If the diameter of the penetrating hole of the through hole 101 is excessively small, when the press-fit pin 102 is press-fitted in the through hole 101, an excessive load is applied to the through hole 101. In this case, occurrence of excessive smallness of the diameter of the penetrating hole of the through hole 101 is reduced by increasing the accuracy of the diameter of the penetrating hole of the through hole 101. In addition, when positional displacement of the diameter of the penetrating hole of the through hole 101 occurs, the press-fit pin 102 is diagonally press-fitted in the through hole 101, and thus an excessive load is applied to the through hole 101. In this case, occurrence of diagonal press-fitting of the press-fit pin 102 in the through hole 101 is reduced by increasing the accuracy of the position of the penetrating hole of the through hole 101. However, when the accuracy of the diameter of the penetrating hole of the through hole 101 or the accuracy of the position of the penetrating hole of the through hole 101 is increased, there is apprehension that the manufacturing cost of the printed substrate 100 may increase.

Hereinafter, an embodiment will be described in detail with reference to the drawings. The configuration of the embodiment below is an example, and the present disclosure is not limited to the configuration of the embodiment.

Figure 1:
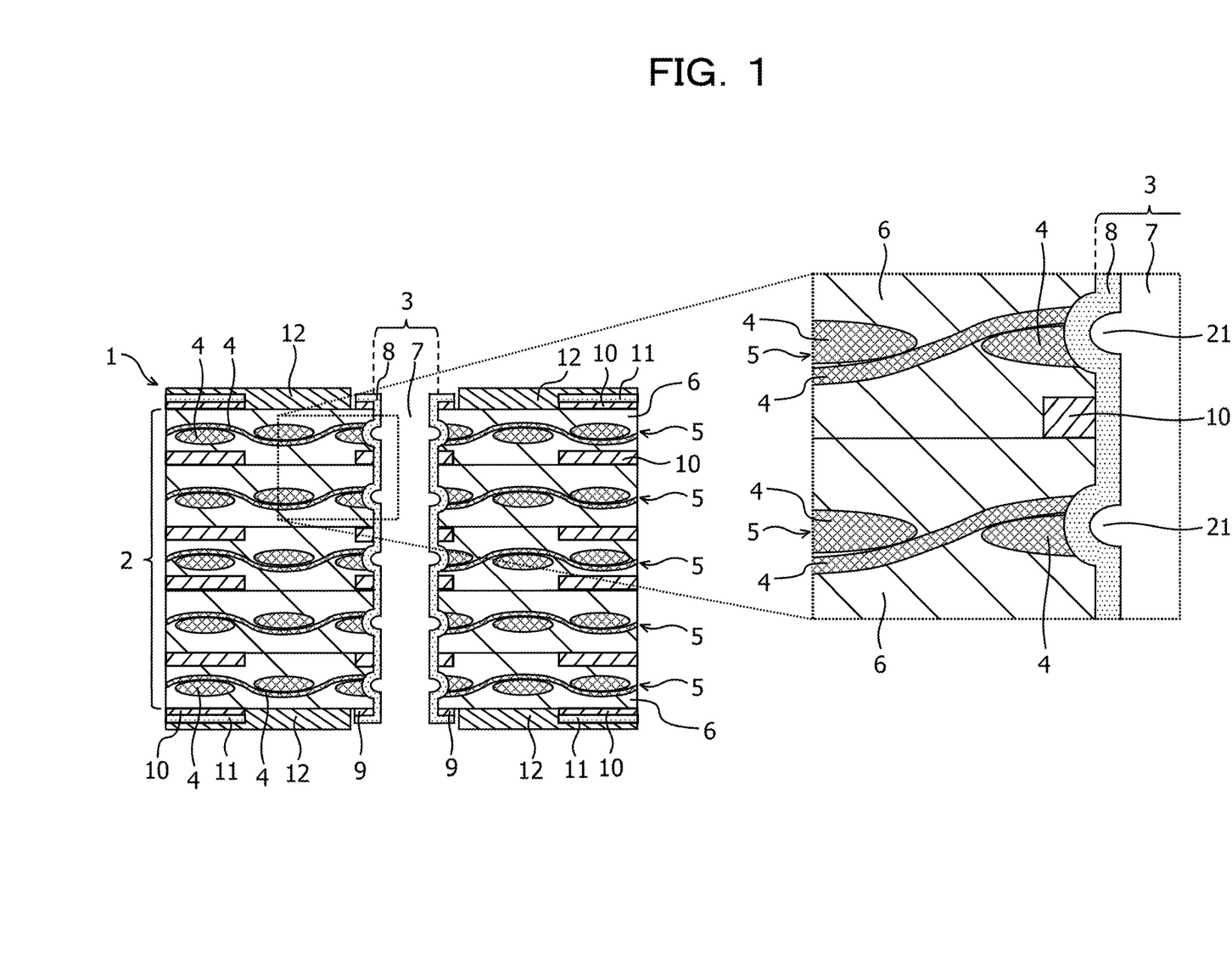
FIG. 1 is a sectional view of a printed substrate.

FIG. 1 is a sectional view of the printed substrate 1. The printed substrate (circuit substrate) 1 includes an insulation layer 2 and through holes 3 provided in the insulation layer 2. The printed substrate 1 includes one or more through holes 3. The insulation layer 2 is formed by impregnating a glass cloth (glass fabric) 105 woven from a plurality of glass fibers 4 with a resin 6. Although the insulation layer 2 illustrated in FIG. 1 has a plurality of layers, the insulation layer 2 is not limited to the structural example of the insulation layer 2 illustrated in FIG. 1, and may be a single layer. The printed substrate 1 is an example substrate.

Figure 2:
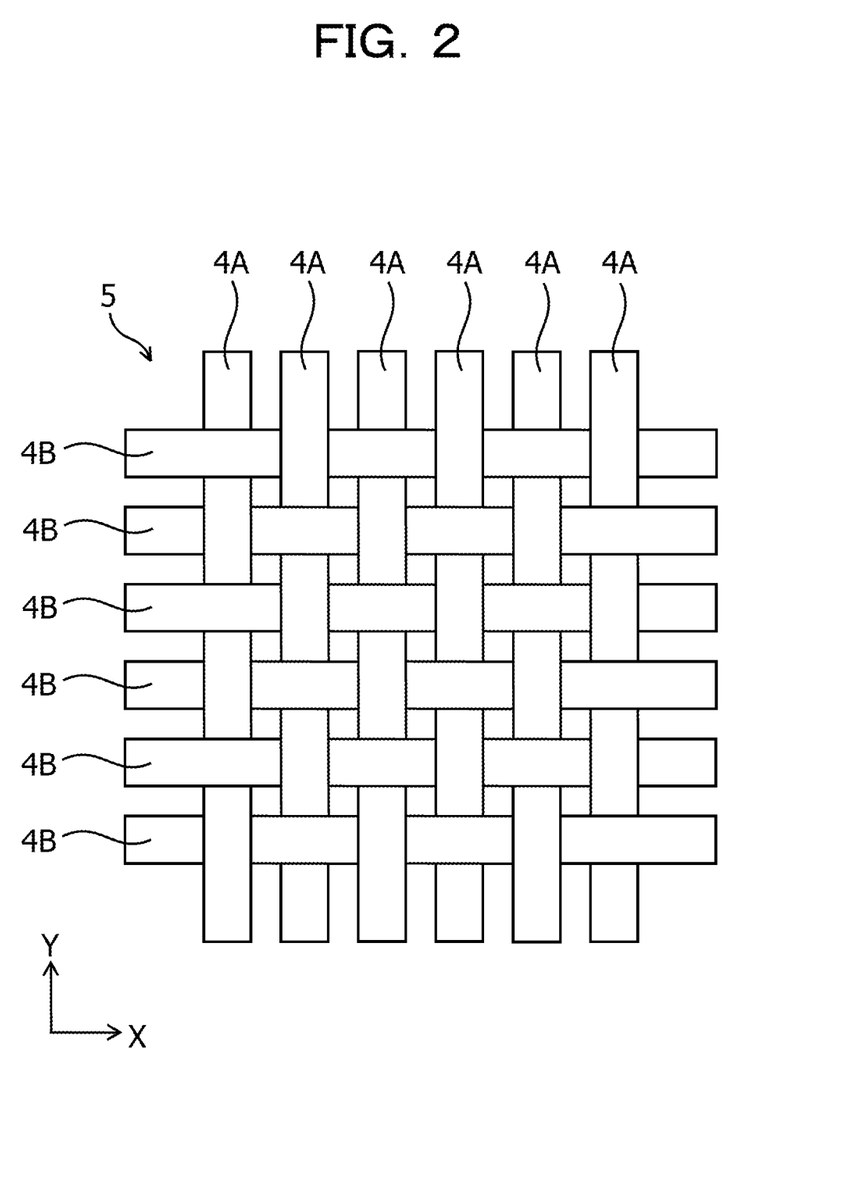
FIG. 2 is a plan view illustrating an example glass cloth included in an insulation layer.

The glass cloth 5 is disposed to spread in a planar direction of the insulation layer 2. FIG. 2 is a plan view illustrating an example of the glass cloth 5 included in the insulation layer. The glass cloth 5 illustrated in FIG. 2 has a structure woven by a plurality of glass fibers 4A disposed side by side in X direction (horizontal direction), and a plurality of glass fibers 4B disposed side by side in Y direction (vertical direction). The glass cloth 5 illustrated in FIG. 2 has areas where the glass fibers 4A and the glass fibers 4B intersect, and areas where the glass fibers 4A and the glass fibers 4B do not intersect.

The resin 6 is, for instance, an epoxy resin, a polyimide resin, or a phenol resin. However, the resin 6 is not be limited to these resins, and may be another resin. The through hole 3 has plating 8 formed in a hole 7 provided in the insulation layer 2 and the inner circumferential surface of the hole 7. The hole 7 penetrates through the insulation layer 2 and has an opening in a first surface and a second surface of the insulation layer 2. The second surface of the insulation layer 2 is the surface opposite to the first surface of the insulation layer 2.

Plating 8 covers the inner circumferential surface of the hole 7 as well as a land (electrode pad) 9 formed around the opening of the hole 7. The plating 8 covers the land 9 formed on the first surface of the insulation layer 2, and covers the land 9 formed on the second surface of the insulation layer 2, thereby electrically connecting the first surface and the second surface of the printed substrate 1. The second surface of printed substrate 1 is the surface opposite to the first surface of the printed substrate 1. A wiring pattern 10 is formed on the first surface, the second surface, and inwardly of the insulation layer 2. When the plating 8 and the wiring pattern 10 formed inwardly of the insulation layer 2 are in contact with each other, the wiring pattern 10 in contact with the plating 8 and the through hole 3, are electrically connected. Plating 11 is formed on the wiring pattern 10 formed on the first surface and the second surface of the insulation layer 2. A resist 12 is formed on the first surface and the second surface of the insulation layer 2. In the configuration example of the printed substrate 1 illustrated in FIG. 1, the wiring pattern 10 and the plating 11 formed on the first surface and the second surface of the insulation layer 2 are covered by the resist 12.

Figure 3:
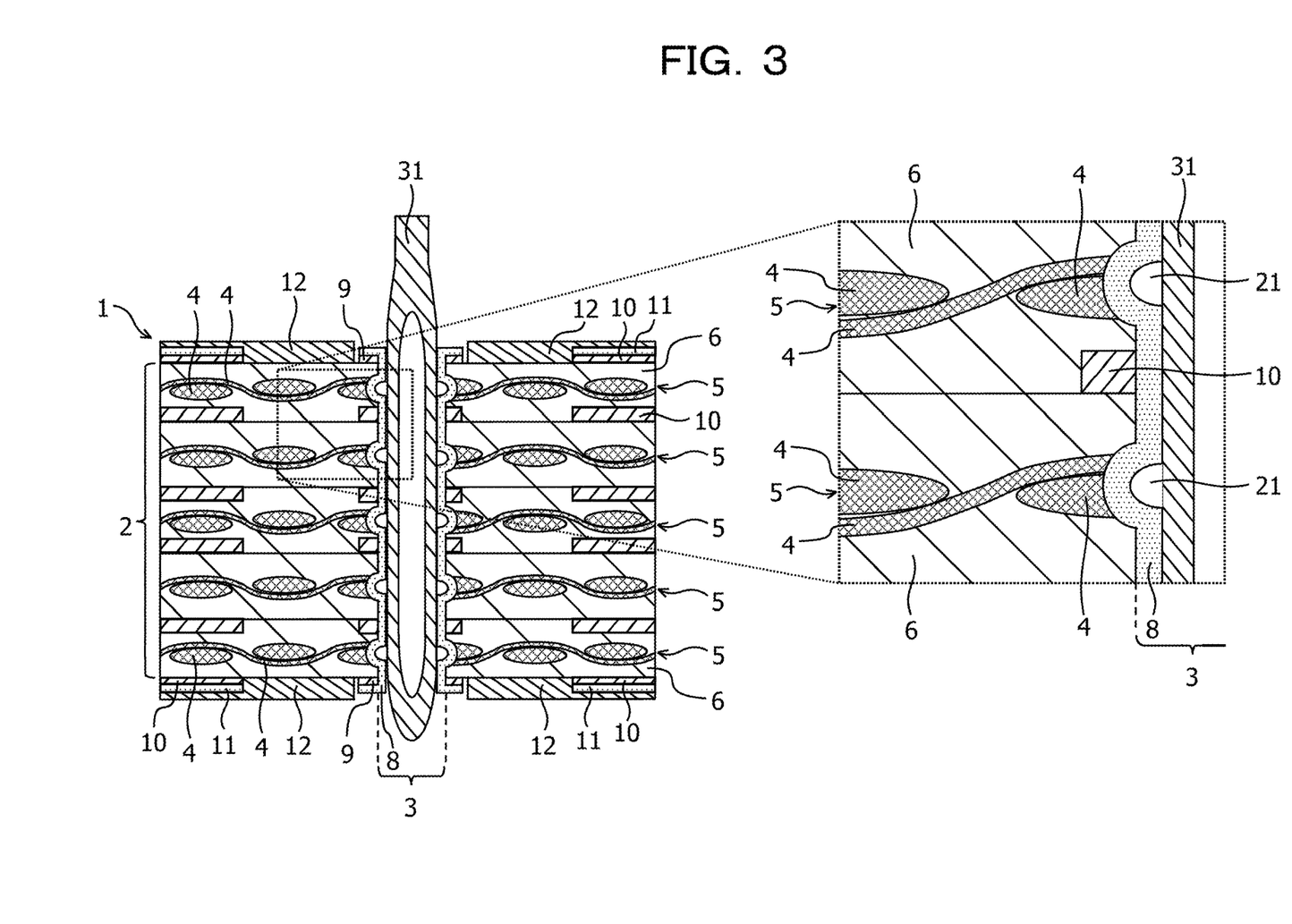
FIG. 3 is a sectional view of a printed substrate.

The location, intersecting with each glass cloth 5, of the outer circumferential portion of the through hole 3 has an recessed portion 21 that is recessed toward the outside of the hole 7. The plating 8 is also formed in the inner surface of the recessed portion 21. FIG. 3 is a sectional view of the printed substrate 1. As illustrated in FIG. 3, a press-fit pin 31 is press-fitted in the through hole 3. The press-fit pin 31 has a structure including a spring elastic section. The diameter of the press-fit pin 31 is greater than the diameter (diameter of the hole 7) of the through hole 3, and the press-fit pin 31 is formed to allow elastic deformation. When the press-fit pin 31 is press-fitted in the through hole 3, the through hole 3 is pressed by the elastic force of the press-fit pin 31, and the press-fit pin 31 is electrically connected as well as mechanically fixed to the through hole 3. Thus, the press-fit pin 31 is mounted in the printed substrate 1.

In the configuration example of the printed substrate 1 illustrated in FIG. 3, the press-fit pin 31 is press-fitted in the through hole 3 from the first surface of the printed substrate 1, and the leading end of the press-fit pin 31 projects from the second surface of printed substrate 1. The embodiment is not limited to the configuration example of the printed substrate 1 illustrated in FIG. 3, and the leading end of the press-fit pin 31 may not project from the second surface of printed substrate 1, and the leading end of the press-fit pin 31 may be positioned inwardly of the through hole 3.

As illustrated in FIG. 1, the location, intersecting with each glass cloth 5, of the outer circumferential portion of the through hole 3 is provided with the recessed portion 21. When the press-fit pin 31 is press-fitted in the through hole 3, the press-fit pin 31 is brought into contact with a portion other than the location, intersecting with each glass cloth 5, of the outer circumferential portion of the through hole 3. Or, the press-fit pin 31 is almost not brought into contact with the location, intersecting with each glass cloth 5, of the outer circumferential portion of the through hole 3. In this manner, the pressure from the press-fit pin 31 when the press-fit pin 31 is press-fitted in the through hole 3 is received by the portion other than the location, intersecting with each glass cloth 5, of the outer circumferential portion of the through hole 3. For this reason, the pressure from the press-fit pin 31 is not directly applied to each glass cloth 5 around the through hole 3. Therefore, the pressure applied to each glass cloth 5 around the through hole 3 is reduced, and thus occurrence of damage to the glass cloth 5 around the through hole 3 is reduced. Consequently, occurrence of an air gap in the glass cloth 5 around the through hole 3 is reduced.

As illustrated in FIG. 3, the location, intersecting with each glass cloth 5, of the outer circumferential portion of the through hole 3 is provided with the recessed portion 21. When the press-fit pin 31 is press-fitted in the through hole 3 and the press-fit pin 31 is mounted in the printed substrate 1, the through hole 3 is pressed by the elastic force of the press-fit pin 31, and a pressure is applied to the insulation layer 2 around the through hole 3. In this case, the press-fit pin 31 is brought into contact with a portion other than the location, intersecting with each glass cloth 5, of the outer circumferential portion of the through hole 3, and thus a pressure is applied to the insulation layer 2 around the through hole 3. In this manner, the pressure from the press-fit pin 31 due to the elastic force of the press-fit pin 31 is received by the portion other than the location, intersecting with each glass cloth 5, of the outer circumferential portion of the through hole 3. For this reason, the pressure from the press-fit pin 31 is not directly applied to each glass cloth 5 around the through hole 3. Therefore, the pressure applied to each glass cloth 5 around the through hole 3 is reduced, and thus occurrence of damage to the glass cloth 5 around the through hole 3 is reduced. Consequently, occurrence of an air gap in the glass cloth 5 around the through hole 3 is reduced.

When the press-fit pin 31 is mounted in the printed substrate 1, the plating 8 formed in the inner circumferential surface of the hole 7 is in contact with the press-fit pin 31, but the plating 8 formed in the inner surface of the recessed portion 21 is not in contact with the press-fit pin 31. Since the plating 8 formed in the inner circumferential surface of the hole 7 is in contact with the press-fit pin 31, electrical connection between the through hole 3 and the press-fit pin 31 is ensured. Also, the ratio of the opening area of the recessed portion 21 to the area of the inner circumferential surface of the hole 7 is small, thus the reliability of the electrical connection between the through hole 3 and the press-fit pin 31 is not reduced.

Figure 4:
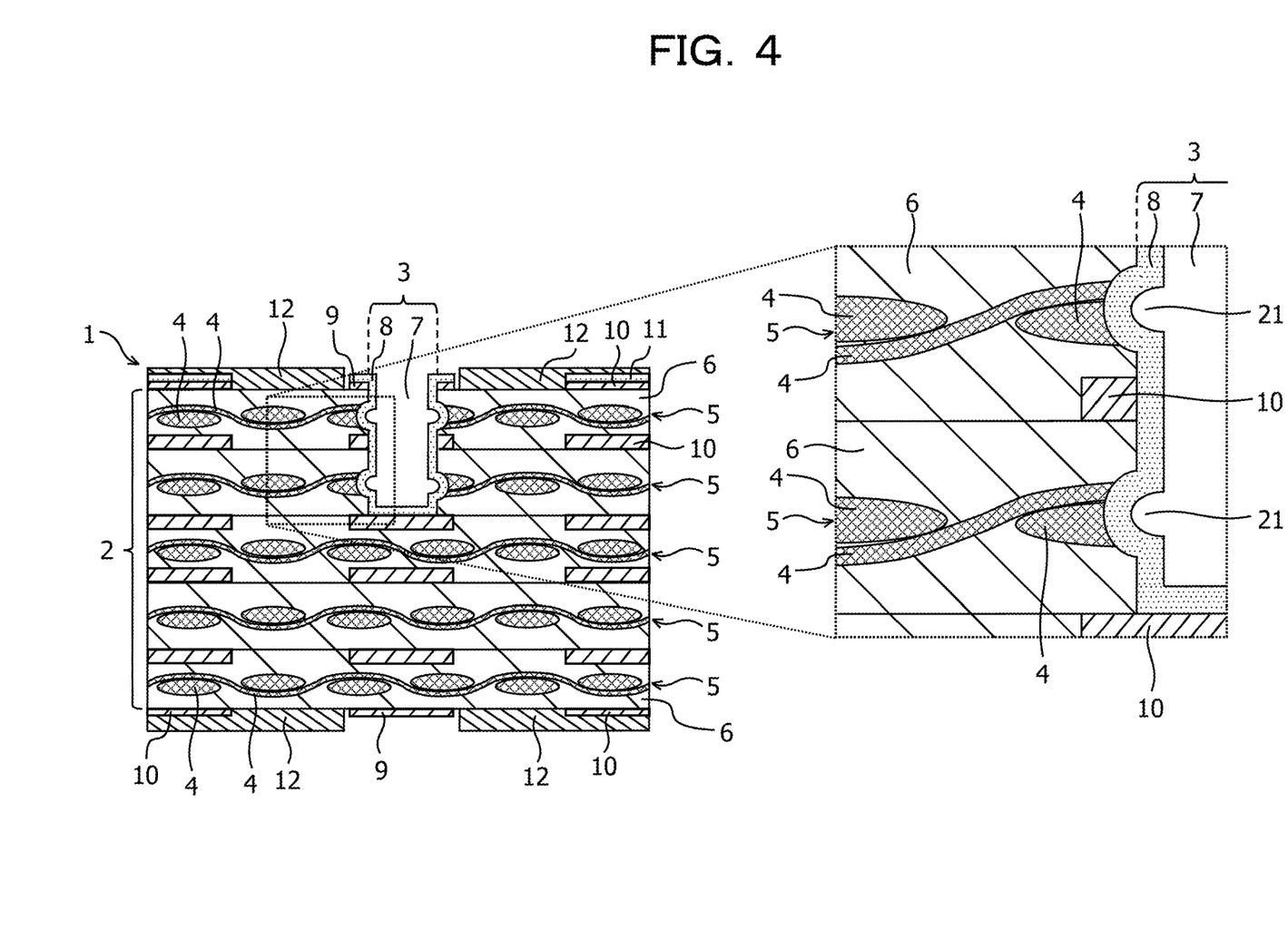
FIG. 4 is a sectional view of a printed substrate.

The through hole 3 provided in the printed substrate 1 illustrated in FIGS. 1 and 3 penetrates through the insulation layer 2. In other words, one end of the hole 7 has a first opening in the first surface of the insulation layer 2, and the other end of the hole 7 has a second opening in the second surface of the insulation layer 2. The embodiment is not limited to the configuration example of the printed substrate 1 illustrated in FIGS. 1 and 3. As illustrated in FIG. 4, the through hole 3 may not penetrate through the insulation layer 2, and may be terminated inwardly of the insulation layer 2. In other words, one end of the hole 7 has an opening in the first surface of the insulation layer 2, and the other end of the hole 7 may be terminated inwardly of the insulation layer 2. Also, one end of the hole 7 may have an opening on the second surface of the insulation layer 2, and the other end of the hole 7 may be terminated inwardly of the insulation layer 2. FIG. 4 is a sectional view of the printed substrate 1. As illustrated in FIG. 4, the plating 8 is formed in the inner surface of the hole 7. Specifically, the plating 8 is formed in the inner-side surface (inner circumferential surface) and the bottom surface of the hole 7. In the configuration example of the printed substrate 1 illustrated in FIG. 4, the plating 8 formed in the bottom surface of the hole 7 is in contact with the wiring pattern 10 formed inwardly of the insulation layer 2. The insulation layer 2 may include a through hole 3 which penetrates through the insulation layer 2, and a through hole 3 which does not penetrate through the insulation layer 2. In other words, the insulation layer 2 includes a plurality of through holes 3 which include a through hole 3 which penetrates through the insulation layer 2, and a through hole 3 which does not penetrate through the insulation layer 2.

Figure 5:
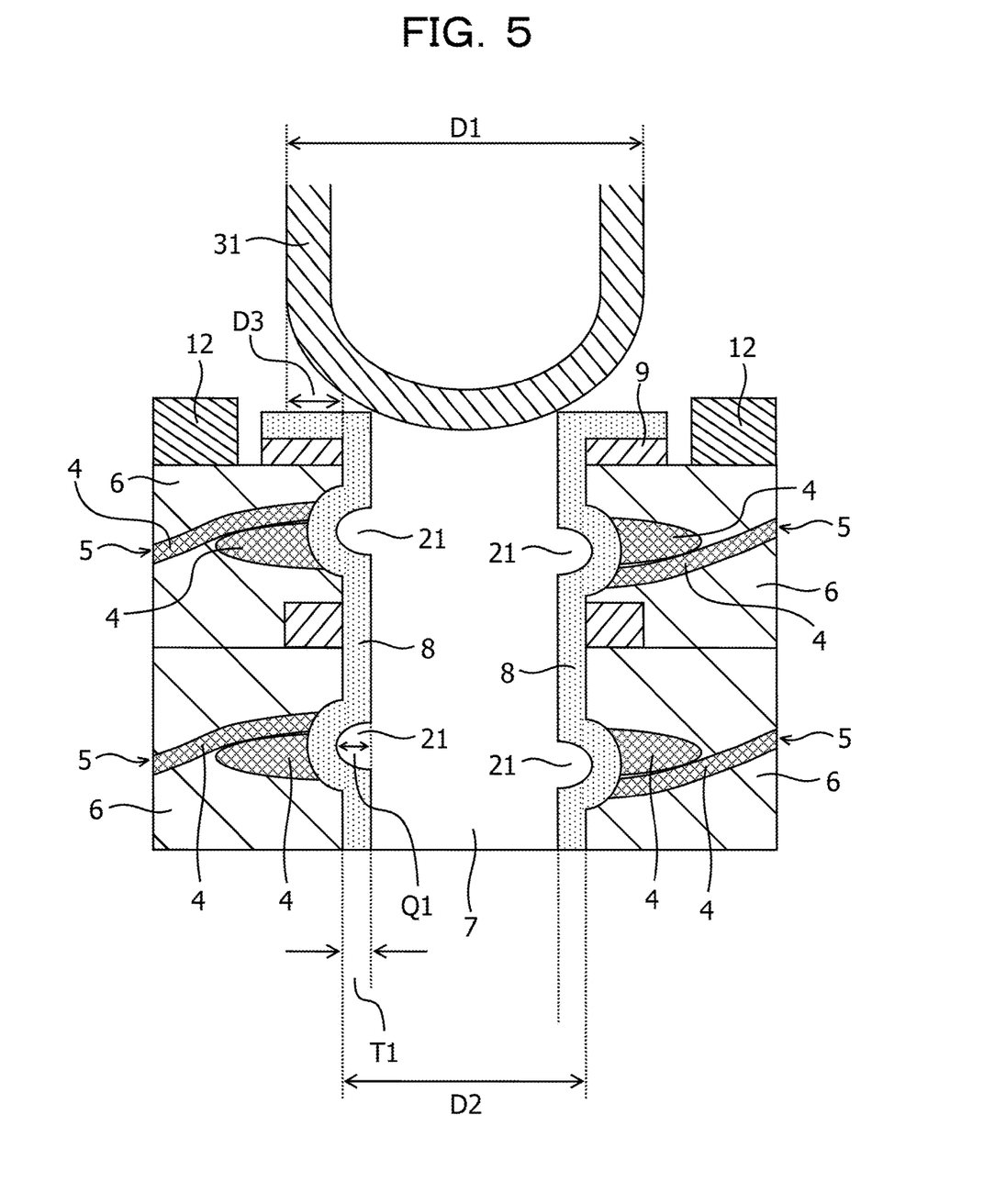
FIG. 5 is an explanatory diagram of an amount of recess of a recessed portion.

Referring to FIG. 5, the amount of recess of the recessed portion 21 (the depth of the recessed portion 21) will be described. The amount of recess (Q1 in FIG. 5) of the recessed portion 21 is greater than or equal to the thickness (T1 in FIG. 5) of the plating 8. When the press-fit pin 31 is press-fitted in the through hole 3, friction occurs between the press-fit pin 31 and the plating 8, and the plating 8 formed in the inner circumferential surface of the hole 7 may be scraped off. Depending on the magnitude of the load applied to the press fit pin 31, the plating 8 formed in the inner circumferential surface of the hole 7 may be scraped off, and the thickness of the plating 8 formed in the inner circumferential surface of the hole 7 may be reduced. Even when the thickness of the plating 8 formed in the inner circumferential surface of the hole 7 is reduced, conductivity between the through hole 3 and the press-fit pin 31 is ensured as long as the plating 8 remains in the through hole 3 such that the resin 6 is not exposed from the plating 8. The amount of recess of recessed portion 21 is ensured to be greater than or equal to the thickness of the plating 8, and thus even when the thickness of the plating 8 formed in the inner circumferential surface of the hole 7 is reduced, the press-fit pin 31 does not come into contact with the plating 8 formed in the inner surface of the recessed portion 21. Therefore, the pressure from the press-fit pin 31 is not directly applied to each glass cloth 5 around the through hole 3.

If the press-fit pin 31 is hard, when the press-fit pin 31 is press-fitted in the through hole 3, the through hole 3 may be deformed. In consideration of a case where the through hole 3 is deformed, the amount of recess of the recessed portion 21 may be greater than or equal to the thickness of the plating 8, and less than or equal to twice the thickness of the plating 8. Alternatively, the amount of recess of the recessed portion 21 may be less than or equal to half of the value (D3 in FIG. 5) obtained by subtracting the diameter of the hole 7 (D2 in FIG. 5) from the diameter of the press-fit pin 31 (D1 in FIG. 5). However, the load applied to the press fit pin 31 may vary with each press-fit pin 31, and the configuration of the printed substrate 1 may vary with each printed substrate 1. Therefore, the amount of recess of the recessed portion 21 may be determined in a combination of the printed substrate 1 and the press-fit pin 31. In addition, the amount of recess of the recessed portion 21 may be determined by testing the press fitting of the press-fit pin 31 in the through hole 3 for each of the combinations between the printed substrate 1 and the press-fit pin 31.

A method of manufacturing of the printed substrate 1 will be described with reference to FIGS. 6A to 6G. FIGS. 6A to 6G are process charts illustrating an example manufacturing method for the printed substrate 1. The process illustrated in FIG. 6A will be described. An insulation layer 2 is formed by stacking insulation layers 2A to 2E. Each of the insulation layers 2A to 2E is formed by impregnating a glass cloth 5 woven from a plurality of glass fibers 4 with a resin 6. A wiring pattern 10 is formed between adjacent layers (insulation layers 2A to 2E) of the insulation layer 2. In addition, a copper foil 13 is formed on the first surface and the second surface of the insulation layer 2. The stacking direction of the insulation layers 2A to 2E is perpendicular to the planar direction of the insulation layer 2.

Figure 6A:
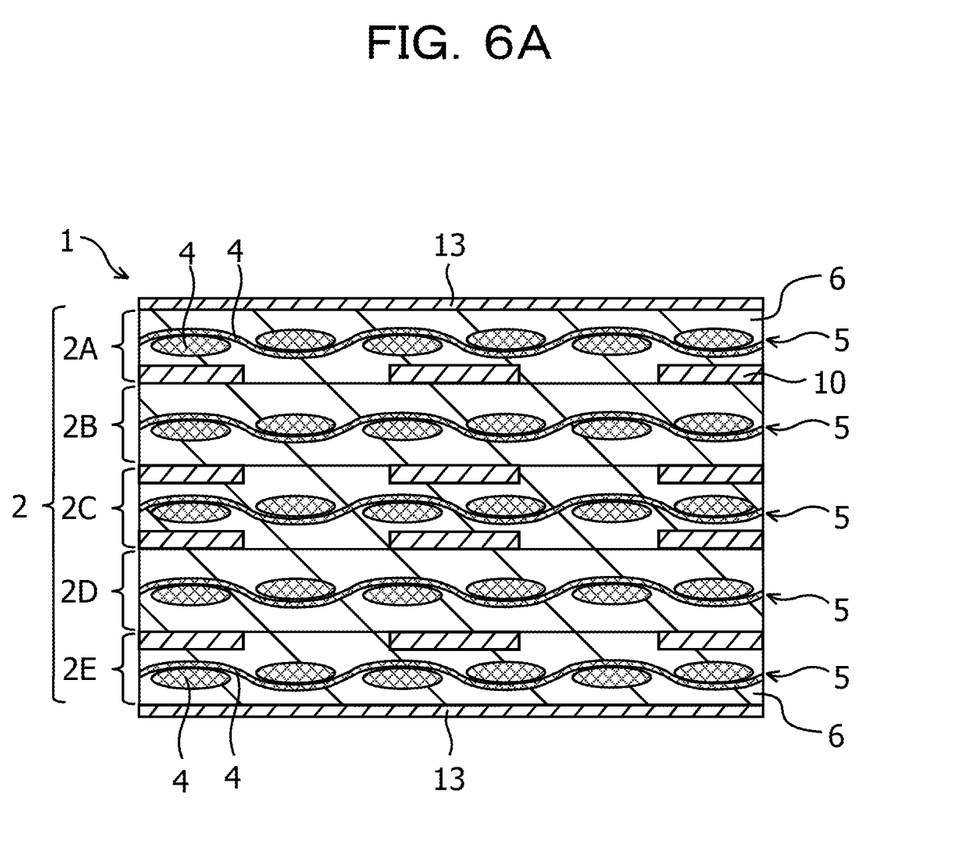
FIG. 6A is a process chart illustrating an example manufacturing method for a printed substrate.
Figure 6B:
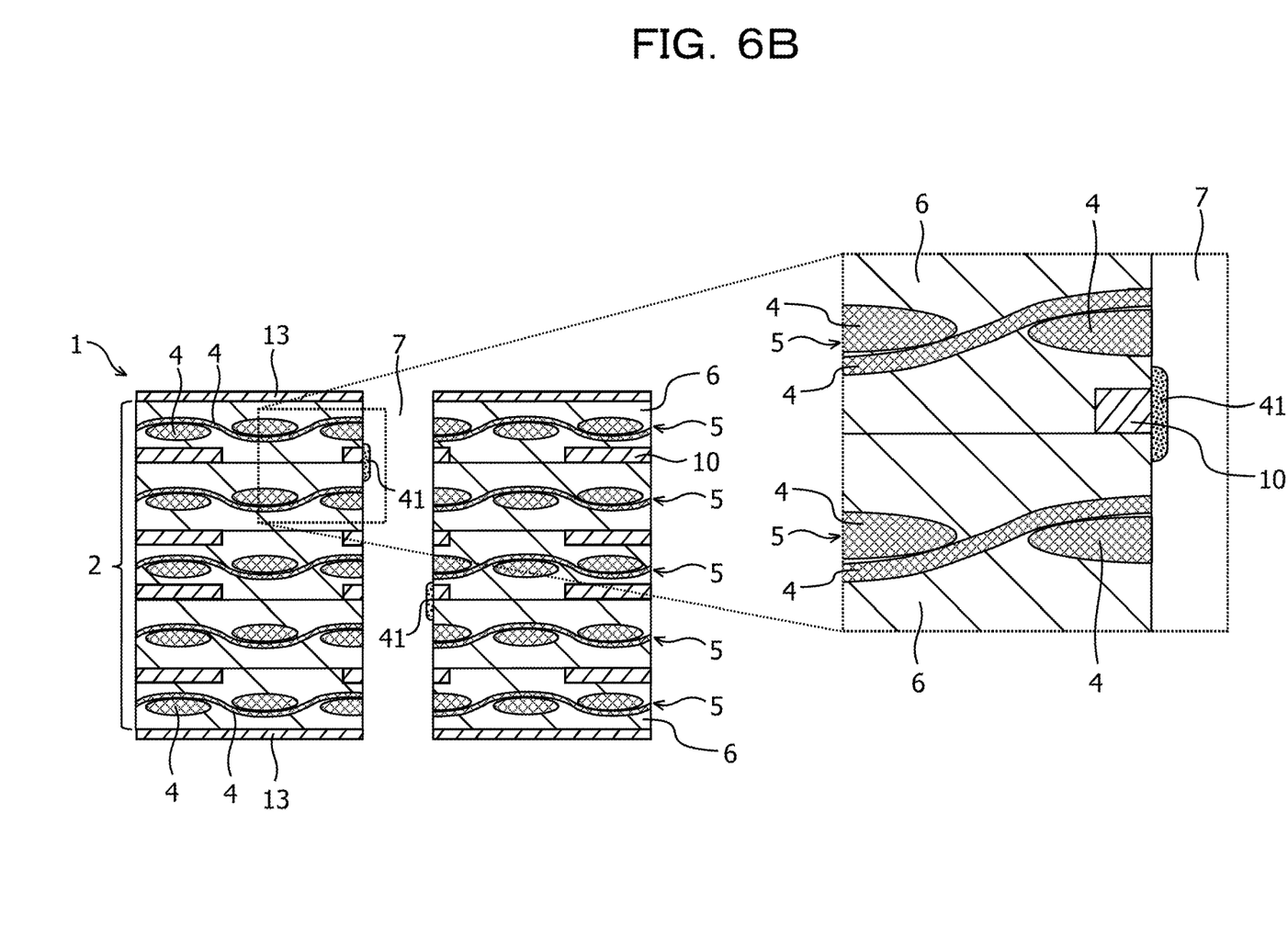
FIG. 6B is a process chart illustrating an example manufacturing method for a printed substrate.
Figure 6C:
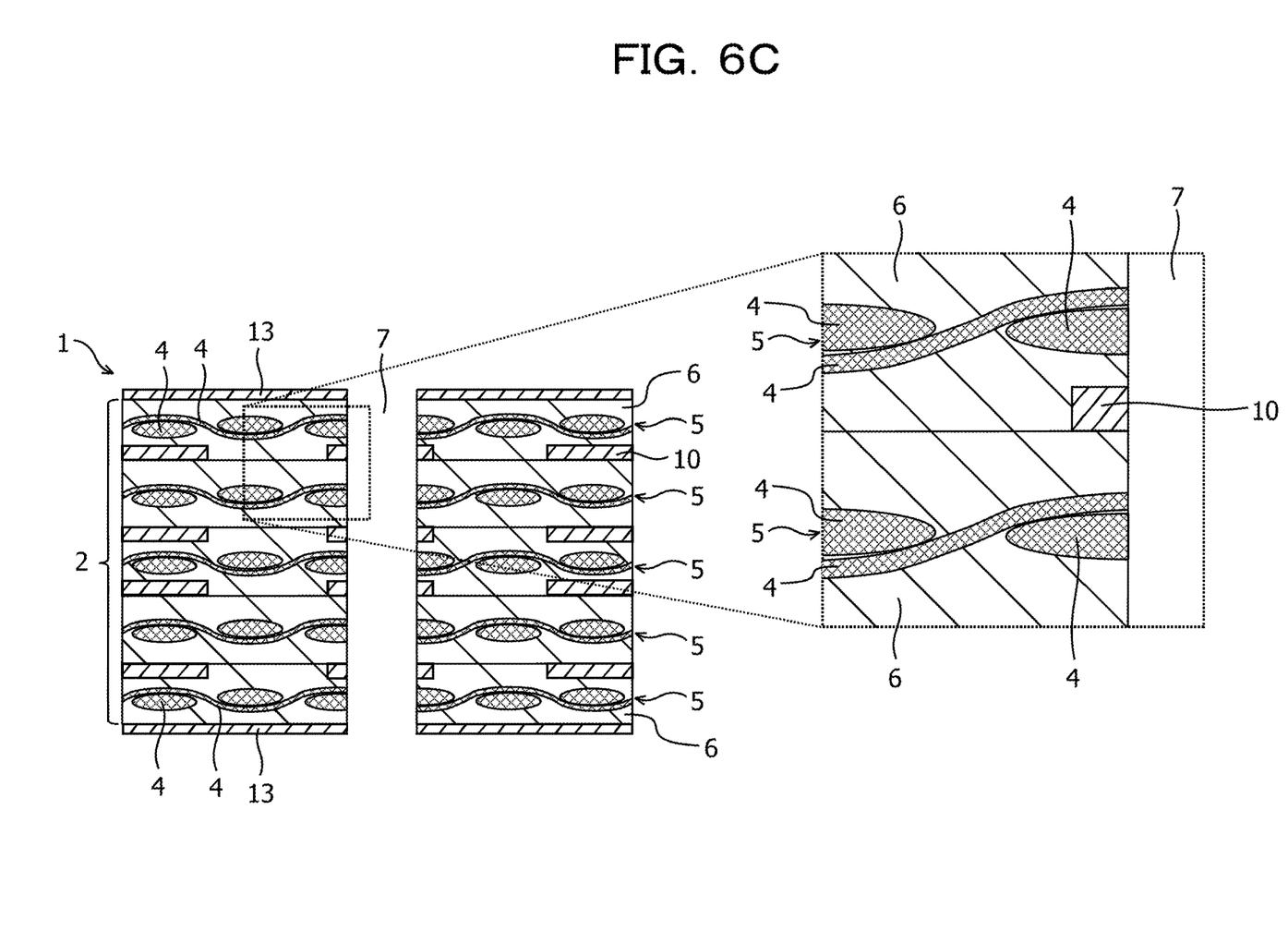
FIG. 6C is a process chart illustrating an example manufacturing method for a printed substrate.

The process illustrated in FIG. 6B will be described. A hole 7 is formed in the insulation layer 2 by a drill process. The hole 7 penetrates through the insulation layer 2. Alternatively, a hole 7 which is terminated inwardly of the insulation layer 2 may be formed. In the inner circumferential surface of the hole 7, scraping dregs of the insulation layer 2 and residual substances (smear) 41, such as a resin, melted in the drill process are formed. The process illustrated in FIG. 6C will be described. The inside of the hole 7 is cleaned by desmear processing. Thus, the residual substances 41 in the hole 7 are removed, and the inner circumferential surface of the hole 7 is conditioned. The desmear processing in the process illustrated in FIG. 6C may be, for instance, wet processing using a medical solution such as potassium permanganate or dry processing using plasma.

Figure 6D:
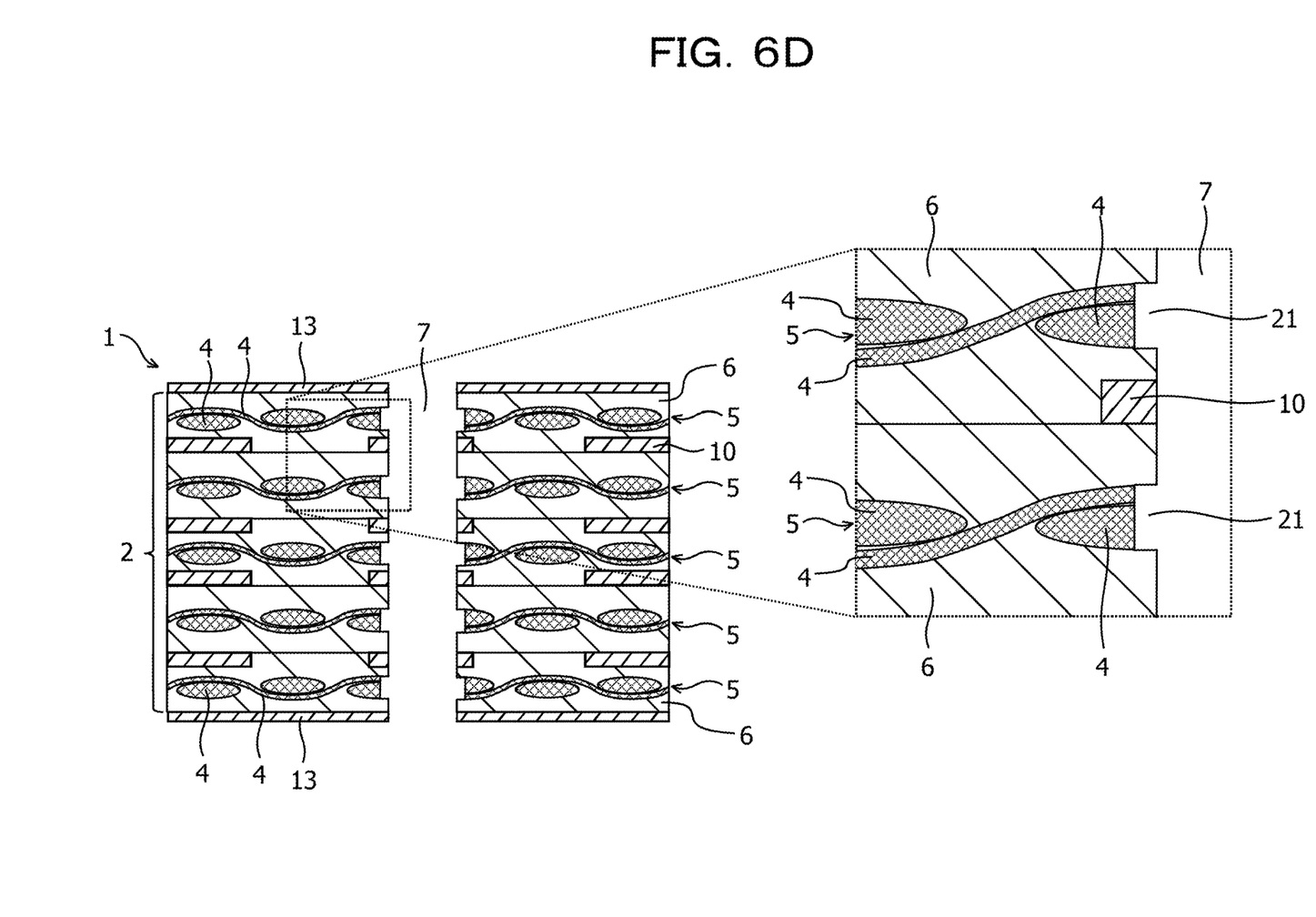
FIG. 6D is a process chart illustrating an example manufacturing method for a printed substrate.

The process illustrated in FIG. 6D will be described. The glass cloth 5 around the hole 7 is partially removed by wet processing using a glass etching agent. Specifically, the recessed portion 21 is formed at the location, intersecting with each glass cloth 5, of the outer circumferential portion of the hole 7 by etching the glass cloth 5 exposed from the inner surface of the hole 7. The glass etching agent is, for instance, hydrofluoric acid, ammonium hydrogen fluoride, and hydrofluoric-nitric acid. Part of the glass cloth 5 around the hole 7 is exposed from the inner circumferential surface of the hole 7. The glass cloth 5 around the hole 7 is partially removed by etching the glass cloth 5 exposed from the inner surface of the hole 7 using a glass etching agent. The amount of recess of the recessed portion 21 can be adjusted by controlling the processing time of wet processing.

Figure 6E:
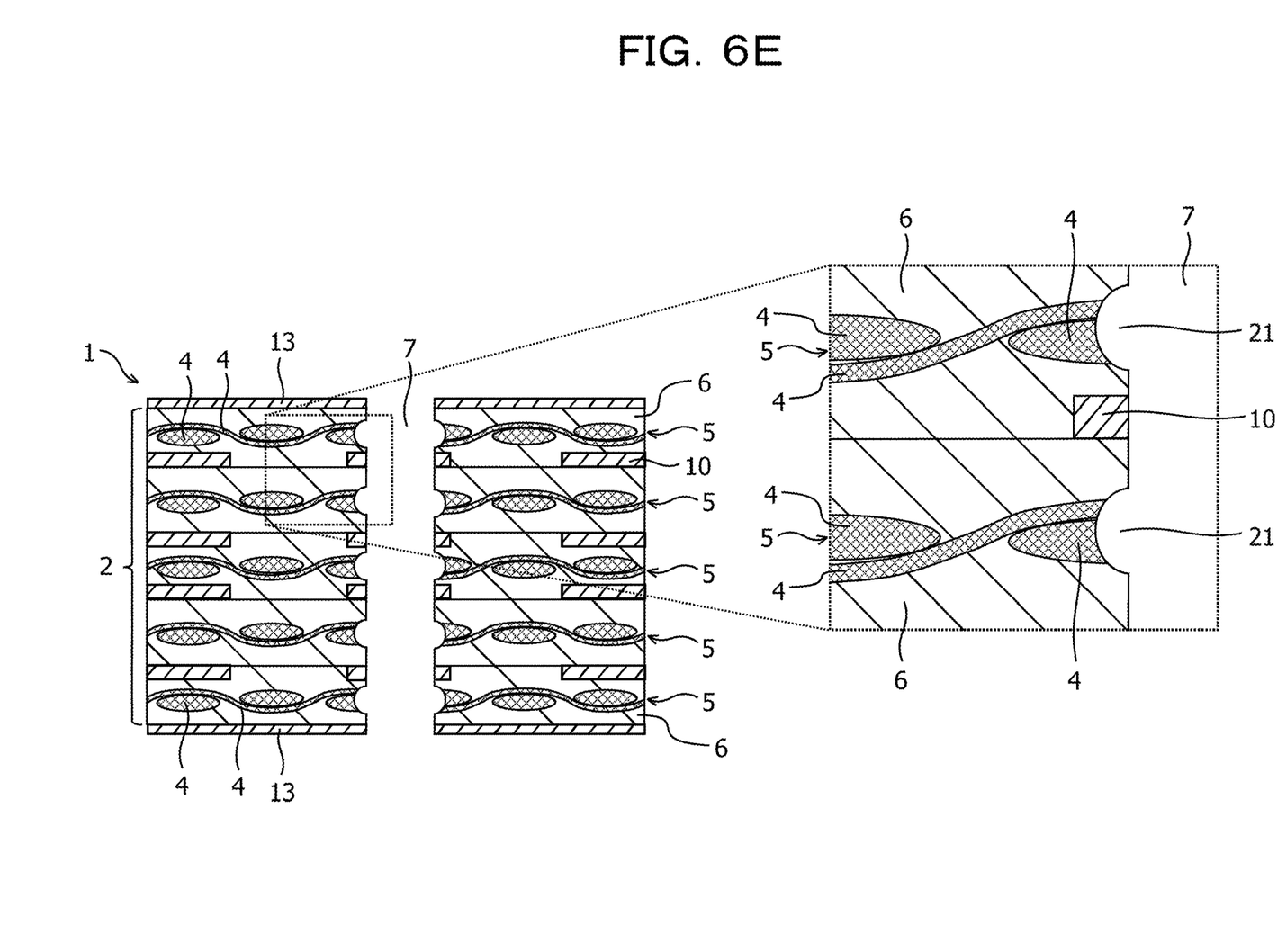
FIG. 6E is a process chart illustrating an example manufacturing method for a printed substrate.

The process illustrated in FIG. 6E will be described. The inner surface of each recessed portion 21 is smoothed by desmear processing. The thickness of the plating 8 formed in the inner surface of each recessed portion 21 can be uniformed by smoothing the inner surface of the recessed portion 21. Also, the strength of each recessed portion 21 is improved by smoothing the inner surface of the recessed portion 21. The desmear processing in the process illustrated in FIG. 6E may be, for instance, wet processing using a medical solution such as potassium permanganate or dry processing using plasma. The process illustrated in FIG. 6E may be omitted. The thickness of the plating 8 formed in the inner surface of the recessed portion 21 may be non-uniform by omitting the process illustrated in FIG. 6E. When the press-fit pin 31 is mounted in the printed substrate 1, the plating 8 formed in the inner surface of the recessed portion 21 and the press-fit pin 31 do not come into with each other. Therefore, even when the thickness of the plating 8 formed in the inner surface of the recessed portion 21 is non-uniform, the reliability of connection between the through hole 3 and the press-fit pin 31 is not reduced.

Figure 6F:
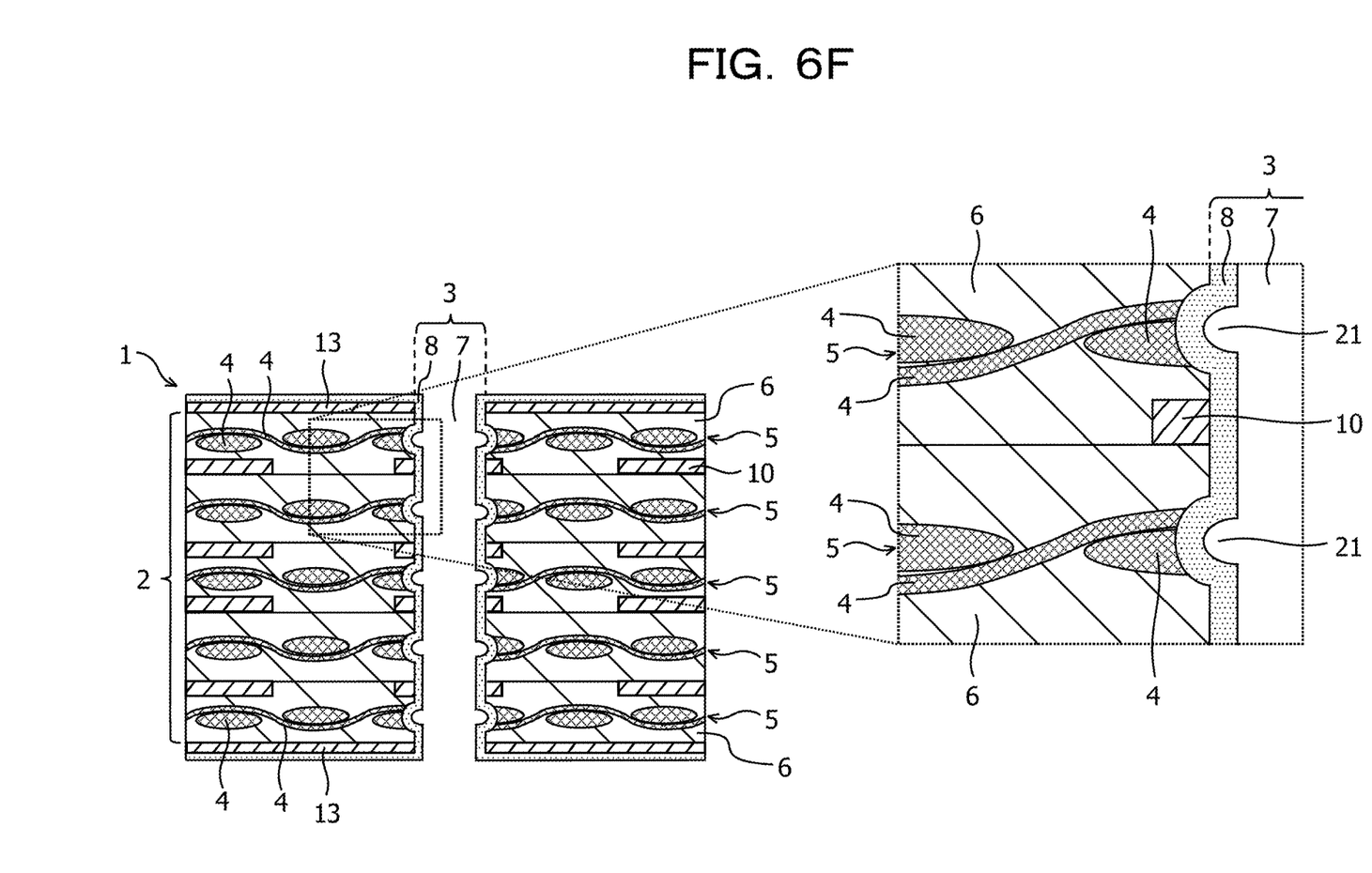
FIG. 6F is a process chart illustrating an example manufacturing method for a printed substrate.
Figure 6G:
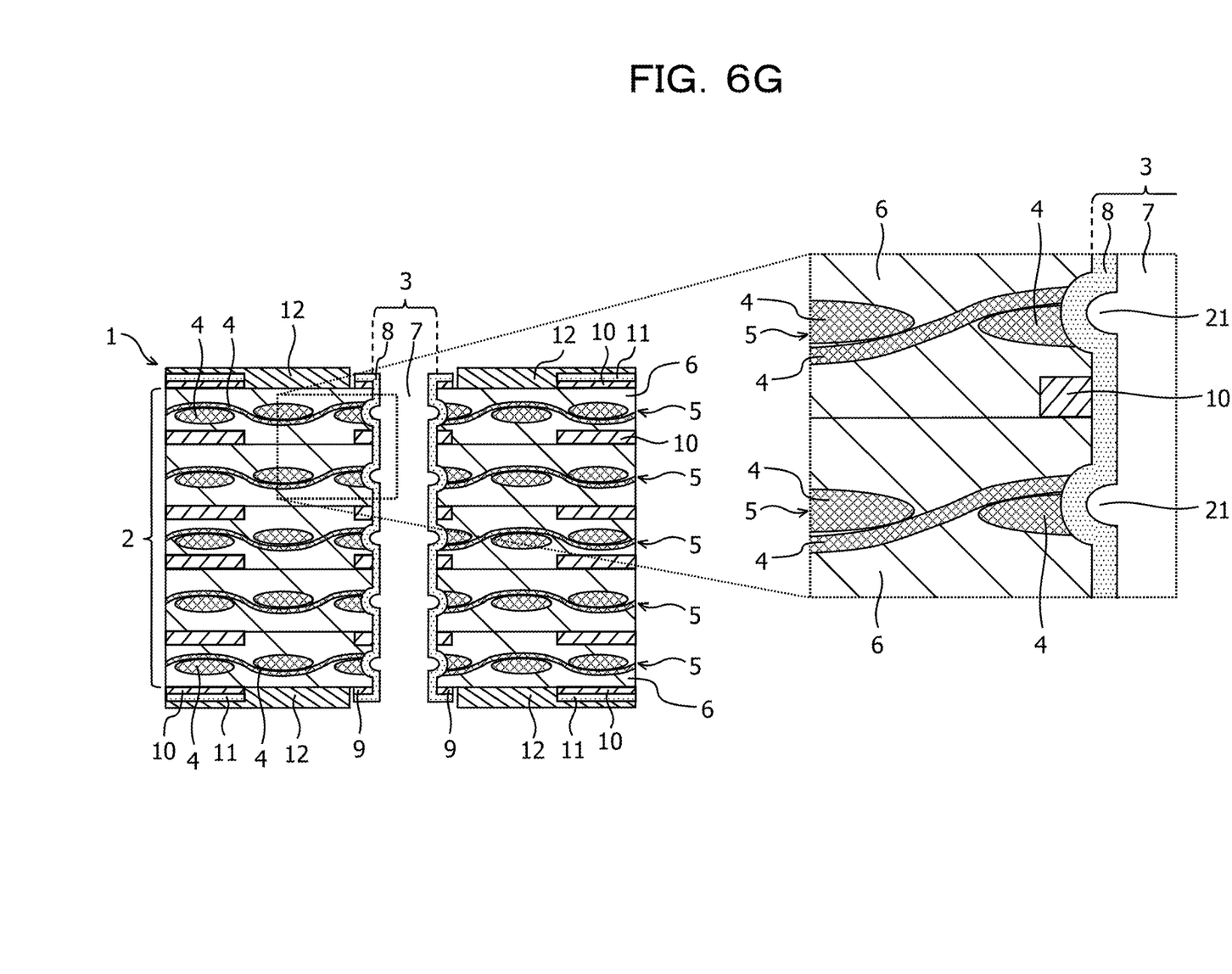
FIG. 6G is a process chart illustrating an example manufacturing method for a printed substrate.

The process illustrated in FIG. 6F will be described. The plating 8 is formed in the inner circumferential surface of the hole 7 and the inner surface of the recessed portion 21 by one of or both of an electroless plating method and an electrolytic plating method. The inner circumferential surface of the hole 7 and the inner surface of the recessed portion 21 are covered by the plating 8, and the copper foil 13 formed on the first surface and the second surface of the insulation layer 2 are covered by the plating 8. Consequently, the through hole 3 having the hole 7 formed in the insulation layer 2 and the plating 8 formed in the inner circumferential surface of the hole 7 is provided in the printed substrate 1. The process illustrated in FIG. 6G will be described. A land 9 is formed around the opening of the hole 7 by patterning the copper foil 13 and the plating 8 which covers the copper foil 13, and the wiring pattern 10 is formed on the first surface and the second surface of the insulation layer 2. The plating 8 formed in the inner surface of the hole 7 covers the land 9. The patterned plating 11 is formed on the wiring pattern 10. Subsequently, a resist 12 is formed on the first surface and the second surface of the insulation layer 2. The resist 12 covers the wiring pattern 10 and the plating 11 formed on the first surface and the second surface of the insulation layer 2. The resist 12 does not cover the through hole 3, and the through hole 3 is exposed from the resist 12.

With the printed substrate 1 and the method of manufacturing the printed substrate 1 according to the embodiment, occurrence of an air gap in the glass cloth 5 around the through hole 3 is reduced. Therefore, the insulating and reliability of the printed substrate 1 are improved. The printed substrate 1 does not have to be designed under the assumption of occurrence of an air gap in the glass cloth 5, thus a narrow pitch of the through holes 3 can be easily achieved for the interval between adjacent through holes 3. Therefore, a narrow pitch of the press-fit pins 31 mounted in the printed substrate 1 can be easily achieved. Also, the interval between the through hole 3 and the wiring pattern 10 can be reduced, and high density of the wiring pattern 10 can be easily achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A substrate comprising:
   an insulation layer that includes a glass cloth layer including a glass cloth impregnated with a resin and a resin layer formed so as to sandwich the glass cloth layer and not including the glass cloth: and
   a through hole having a hole included in the insulation layer and plating formed in an inner surface of the hole,
   a side surface of the glass cloth on a side of the hole includes a recessed portion formed so as to be recessed with respect to a side surface of the resin layer on the side of the hole, and
   the plating is recessed toward an outside of the hole at a position of the recessed portion of the glass cloth, and
   a first inner diameter of the through hole at a position of the glass cloth layer is larger than a second inner diameter of the through hole at a portion of the resin layer, wherein the recessed portion is formed so that a press-fit pin is not in contact with the recessed plating at the position of the recessed portion of the glass cloth when the press-fit pin is inserted into the hole.

2. The substrate according to claim 1, wherein an amount of recess of the recessed portion is greater than or equal to a thickness of the plating.

3. The substrate according to claim 1, wherein
   one end of the hole has a first opening in a first surface of the insulation layer,
   the other end of the hole has a second opening in a second surface opposite to the first surface of the insulation layer, and
   the hole penetrates through the insulation layer.

4. The substrate according to claim 1, wherein
   one end of the hole has an opening in a first surface of the insulation layer or a second surface opposite to the first surface, and
   the other end of the hole is terminated in the insulation layer.

* * * * *